(12) United States Patent
Schubert et al.

(10) Patent No.: US 10,341,576 B2
(45) Date of Patent: Jul. 2, 2019

(54) POLARIZATION SENSITIVE IMAGE SENSOR

(71) Applicant: X Development LLC, Mountain View, CA (US)

(72) Inventors: Martin Friedrich Schubert, Mountain View, CA (US); Michael Jason Grundmann, San Jose, CA (US)

(73) Assignee: X Development LLC, Mountain View, CA (US)

( * ) Notice: Subject to any disclaimer, the term of this patent is extended or adjusted under 35 U.S.C. 154(b) by 149 days.

(21) Appl. No.: 15/395,803

(22) Filed: Dec. 30, 2016

(65) Prior Publication Data
US 2018/0191932 A1    Jul. 5, 2018

(51) Int. Cl.
| | |
|---|---|
| G01J 3/02 | (2006.01) |
| H04N 5/238 | (2006.01) |
| G01J 3/28 | (2006.01) |
| G01J 3/447 | (2006.01) |
| H01L 27/146 | (2006.01) |
| H04N 5/235 | (2006.01) |
| H04N 5/225 | (2006.01) |
| H04N 9/04 | (2006.01) |
| G01J 3/51 | (2006.01) |

(52) U.S. Cl.
CPC ............ *H04N 5/238* (2013.01); *G01J 3/0224* (2013.01); *G01J 3/2803* (2013.01); *G01J 3/2823* (2013.01); *G01J 3/447* (2013.01); *G01J 3/513* (2013.01); *H01L 27/14625* (2013.01); *H01L 27/14629* (2013.01); *H04N 5/2254* (2013.01); *H04N 5/2351* (2013.01); *H04N 9/045* (2013.01); *G01J 2003/282* (2013.01); *G01J 2003/2806* (2013.01); *G01J 2003/2813* (2013.01); *G01J 2003/516* (2013.01)

(58) Field of Classification Search
CPC . G01J 4/00; G01J 3/447; G01J 3/2823; G02B 7/256
See application file for complete search history.

(56) References Cited

U.S. PATENT DOCUMENTS

| | | | |
|---|---|---|---|
| 5,416,324 | A  | 5/1995  | Chun |
| 6,850,329 | B2 | 2/2005  | Tobiason et al. |
| 9,336,749 | B2 | 5/2016  | Vetsuypens et al. |
| 2002/0167727 | A1 | 11/2002 | Hansen et al. |
| 2009/0290039 | A1 | 11/2009 | Kanamori et al. |

(Continued)

OTHER PUBLICATIONS

International Search Report and Written Opinion issued in International Application No. PCT/US2017/067256, dated Jun. 20, 2018, 9 pages.

*Primary Examiner* — Thanh Luu
(74) *Attorney, Agent, or Firm* — Fish & Richardson P.C.

(57) ABSTRACT

A device includes a first multi-element image sensor; a second multi-element image sensor; and a polarizing layer positioned between the first and second multi-element image sensors. A portion of light having a first polarization state incident on the device along a first direction is transmitted through the first image sensor, is transmitted through the polarizing layer, and is detected by the second image sensor, and light having a second polarization state orthogonal to the first polarization state incident on the device along the first direction is transmitted through the first image sensor, is blocked by the polarizing layer.

20 Claims, 5 Drawing Sheets

(56) References Cited

U.S. PATENT DOCUMENTS

| | | |
|---|---|---|
| 2013/0188023 A1 | 7/2013 | Kuang et al. |
| 2015/0253192 A1 | 9/2015 | Sano |
| 2016/0163752 A1* | 6/2016 | Sambongi ......... H01L 27/14621 348/222.1 |
| 2016/0173834 A1 | 6/2016 | Bert et al. |
| 2016/0195429 A1 | 7/2016 | Boettiger |

* cited by examiner

POLARIZATION SENSITIVE IMAGE SENSOR

TECHNICAL FIELD

This disclosure generally relates to image sensors.

BACKGROUND

Most conventional image sensors, such as those used in digital cameras, are insensitive to the polarization of detected light. For applications where polarization sensitivity is desired, an absorptive or reflective polarizer is typically placed in the path of the incident light. This results in a reduction of approximately 50% of light that would otherwise be detected by the sensor for unpolarized incident light because one incident polarization state is either substantially absorbed or reflected by the polarizer.

SUMMARY

This disclosure features image sensors that include a pair of sensors stacked one atop the other, with a polarizing layer in between. The upper sensor is partially transmissive to incident light. Thus, any signal from the upper sensor includes a component proportional to the intensity of incident light, insensitive to its polarization state. The upper sensor also transmits a fraction of incident light, insensitive to its polarization state. The transmitted light is incident on the polarizer layer. If the polarizer is a reflective polarizer, most of the blocked polarization state is reflected back to the upper sensor, while most of the pass polarization state is transmitted to the lower sensor. Accordingly, for a reflective polarizer, the upper sensor signal also includes a component attributable to the amount of incident light composed of the blocked polarization state. Similarly, the lower sensor signal is entirely attributable to pass state polarized light, and is therefore indicative of the amount of pass state polarization in the incident light. If an absorptive polarizer is used, the signals from the upper sensor include no additional blocked state component. For appropriately calibrated systems, the ratio of pass to block state polarization at each pixel can be determined by comparing each upper sensor pixel's signal to the corresponding lower sensor pixel signal. Moreover, S/N will generally be improved using the disclosed sensors compared to conventional arrangements because the sensor detects both pass and block state light without discarding all of one polarization state.

In general, in a first aspect, the invention features a device, including: a first multi-element image sensor; a second multi-element image sensor; and a polarizing layer positioned between the first and second multi-element image sensors. A portion of light having a first polarization state incident on the device along a first direction is transmitted through the first image sensor, is transmitted through the polarizing layer, and is detected by the second image sensor, and light having a second polarization state orthogonal to the first polarization state incident on the device along the first direction is transmitted through the first image sensor, is blocked by the polarizing layer.

Embodiments of the device can include one or more of the following features. For example, the polarizing layer can substantially reflect the light having the second polarization state and at least some of the blocked light is detected by the first image sensor.

Each element of the first multi-element image sensor can be registered to a corresponding element of the second multi-element image sensor.

Each element of the first multi-element image sensor can be laterally offset to a corresponding element of the second multi-element image sensor.

Either or both of the first and second multi-element image sensor can be a complementary metal-oxide-semiconductor (CMOS) array, a photodiode array, or a charge-coupled device (CCD) array.

The polarizing layer can be a linear polarizer having a single pass axis direction. The polarizing layer can be a circular polarizer. In some embodiments, the polarizing layer is composed of a plurality of polarizing elements, wherein adjacent polarizing elements have their pass axes differently oriented. Each element of the polarizing layer can correspond to an element of the first multi-element image sensor. The corresponding elements of the polarizing layer and the first multi-element image sensor can be registered with one another. Each element of the polarizing layer can correspond to an element of the second multi-element image sensor. The corresponding elements of the polarizing layer and the second multi-element image sensor can be registered with one another and with corresponding elements of the first multi-element image sensor.

The polarizing layer can include a reflective polarizer and/or an absorptive polarizer.

The polarizing layer can include a polarizing metallic grating, a dielectric grating, or an air gap grating.

In some embodiments, the device can include a color filter layer including an array of color filter elements.

In another aspect, the invention features a system that includes the device and an electronic processing module in communication with the device. During operation, the device detects incident light, sends signals to the electronic processing module, and the electronic processing module determines information about an intensity of the incident light and information about a polarization of the incident light based on the signals. The information about the polarization of the incident light can include a relative intensity of incident light polarized in a first direction and a second direction orthogonal to the first direction. Information about the intensity and polarization can be determined for each of a plurality of locations across the device.

In some embodiments, the system can include one or more optical elements arranged to focus the incident light onto the device. The one or more optical elements can image light onto the device.

In a further aspect, the invention features a camera or a spectroscopic detector that includes the system.

Polarization sensitive sensors may be useful in many imaging or spectroscopic applications where polarization sensitivity is important. Moreover, the disclosed device architectures are achievable using wafer processing techniques, enabling compact, integrated form-factors and large-scale manufacturing in an economic manner, suitable for cell-phone cameras, for example.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
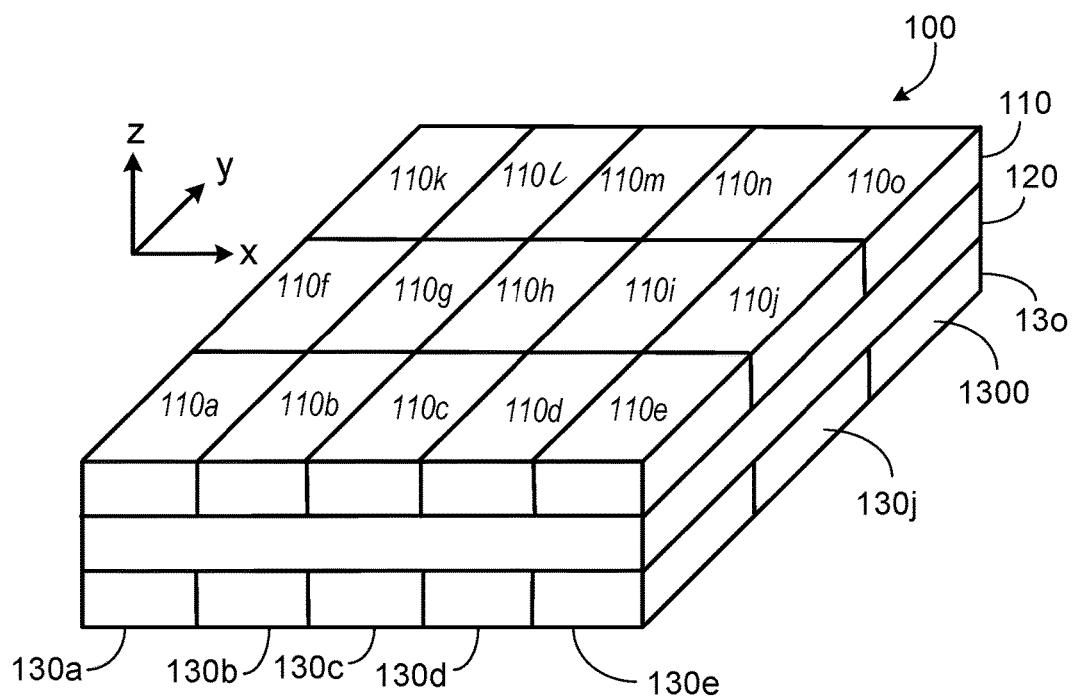
FIG. 1A is a perspective view of an embodiment of a polarization-sensitive sensor.

Referring to FIG. 1A, a polarization-sensitive image sensor 100 include three layers stacked on atop the other: a first sensor layer 110, a second sensor layer 130, and a polarizer layer 120 between the first and second sensor layers. All of the elements are bonded together to provide a compact, integrated package. As described below, image sensor 100 is configured to detect both intensity and polarization information about a light field at different locations across the sensor. Here, light refers to electromagnetic radiation over an operative wavelength range for the sensor. This range can be, for example, the ultraviolet wavelength range (e.g., 200 nm to 400 nm), the visible wavelength range (e.g., 400 nm to 700 nm) or a range of wavelengths in the infrared (e.g., 700 nm to 1,200 nm).

Cartesian axes are shown in FIG. 1A for ease of reference. In this regard, an object's thickness refers to the object's dimension as measured along z-axis. An object's lateral area refers to the object's area in the x-y plane. "Top" and "bottom" refer to the +z and −z directions, respectively. For example, the top surface of sensor 100 refers to the surface facing in the +z direction, while the bottom surface refers to the opposite surface. Sensor layer 110 is sometimes referred to as the top sensor layer below, and sensor layer 130 is correspondingly the bottom sensor layer.

Top sensor layer 110 and bottom sensor layer 130 each include an array of sensor elements. As shown, top sensor layer 110 includes a 3×5 array of individual sensor elements 110a-110o. Bottom sensor layer 130 include a similar 3×5 array of individual sensor elements 130a-130o. Each sensor element of the top sensor layer has the same lateral dimensions as and is registered with a corresponding sensor element of the bottom sensor layer.

In general, top and bottom sensor layers 110 and 130 are active-pixel sensor arrays composed of integrated circuits containing an array of pixel sensors, each pixel sensor containing a photodetector and an active amplifier. Common active-pixel sensor technologies that can be used include complementary metal-oxide-semiconductor (CMOS) sensor technology and charge-coupled device (CCD) sensor technology.

The sensor arrays are depicted as having a relatively small number of pixel sensors for illustrative purposes. More generally, much larger pixel counts are typical. For example, each array can include up to several million pixel sensors (e.g., 1 MP or more, 4 MP or more, 8 MP or more, 10 MP or more, 12 MP or more, 15 MP or more, such as up to 20 MP).

In general, the bottom sensor layer can have an architecture similar to conventional active-pixel sensor arrays, such as those used typically for digital cameras for example. The top sensor layer, on the other hand, absorbs (generating photocarriers which subsequently contribute to a detection signal) only a portion of incident light but transmits a substantial amount of incident light. For example, each sensor element in the top sensor layer can transmit about 10% or more (e.g., 20% or more, 30% or more, 40% or more, 50% or more, 60% or more, 70% or more, such as up to 80%) of light normally incident thereon.

Various architectures for providing both light detection and light transmission are possible. For example, in some embodiments, each sensor includes a semiconductor layer which generates photocarriers upon interaction with incident photons of appropriate energy. These regions can be designed to fill only a fraction of the available aperture of each sensor element, allowing photons incident on other portions of the sensor to be transmitted. In this case, for each pixel, the polarizer should be at least as large as the aperture through which the top sensor layer transmits light. Alternatively, or additionally, the photocarrier-generating layer can be sufficiently thin so as to absorb only a fraction of incident photons of appropriate energy. As yet a further alternative, in some embodiments, the top sensor can use a semiconductor material with a larger bandgap and, hence, lower absorption than the bottom sensor.

Although not depicted in FIG. 1A, in general, adjacent elements in the same layer of the sensors described herein may be separated by, e.g., a light absorbing material and/or a passivating material.

In general, polarizer layer 120 includes a planar polarizing element, such as a polarizing metallic grating. Polarizing metallic gratings, also referred to as wire-grid polarizers, are composed of narrow, spaced-apart parallel metal strips. Commonly used metals are aluminum and gold, although other metals can be used. Typically, the strips are spaced periodically, with a period that is smaller than the operating wavelength of polarization-sensitive image sensor 100. For example, where the operating wavelength is in the visible part of the spectrum, the grating period can be about 200 nm or less (e.g., 150 nm or less, 100 nm or less, 80 nm or less, 50 nm or less).

For normally incident light, a polarizing metallic grating operates as a reflective linear polarizer, substantially transmitting linearly polarized light with its electric field orthogonal to the grating lines, while substantially reflecting linearly polarized light with its electric field parallel to the grating lines.

Figure 1B:
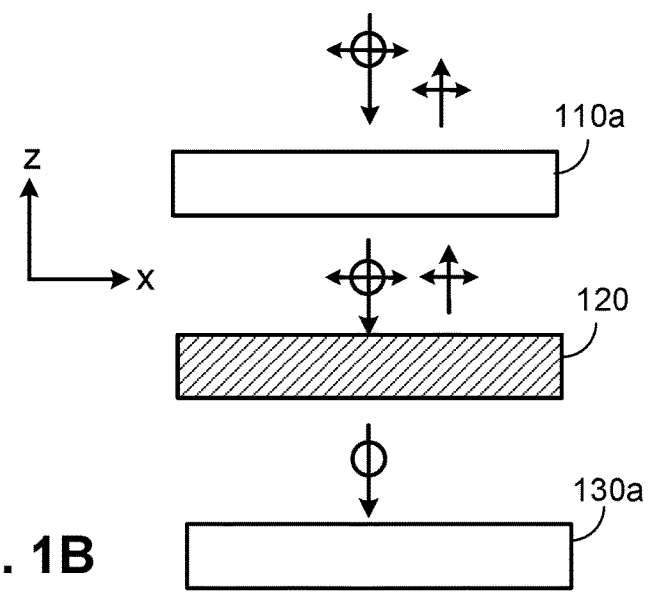
FIG. 1B is an exploded cross-sectional view of a single element of the polarization-sensitive sensor shown in FIG. 1A.

Referring also to FIG. 1B, the operation of sensor 100 is explained with reference to a single sensor pixel composed of sensor element 110a, sensor element 130a, and the portion of polarizer layer 120 adjacent these sensor elements. Normally-incident light propagating in the −z direction is incident on the top surface of sensor element 110a. For light composed of both s- and p-polarized light, a certain proportion of light of each polarization state is absorbed by sensor element 110a, contributing to the signal from that element. Here, for FIG. 1B, s-polarized light refers to light plane polarized with its electric field vector parallel to the y-direction and p-polarized light refers to light plane polarized with its electric field vector parallel to the x-direction. More generally, s-polarized light refers to light plane polarized with its electric field vector perpendicular to a plane of incidence defined by the incident direction and the surface normal, while p-polarized light refers to orthogonal plane polarized light. The grating lines extend along the x-direction so that p-polarized light is substantially reflected, while s-polarized light is substantially transmitted. In any event, assuming top sensor element 110*a* is equally sensitive to both polarization states, a certain proportion, t, of light of each polarization state is transmitted through the bottom surface of the sensor where it is incident on polarizer layer 120. This means that a proportion, (1−t), of incident light of each polarization state is absorbed by sensor 110*a*, is converted to photocarriers, and contributes to a detection signal from sensor 110*a*, $V_{110}$.

Polarizer layer 120 is arranged to transmit substantially all (e.g., 95% or more, 98% or more, 99% or more) incident s-polarized light and reflect substantially all (e.g., 95% or more, 98% or more, 99% or more) p-polarized light.

The transmitted s-polarized light in incident on sensor element 130*a*, where it is absorbed and produces a signal related to (e.g., proportional to) its intensity at the sensor. Accordingly, for purposes of simplicity, if one considers polarizer layer 120 to be a perfect polarizer and ignoring Fresnel reflections between layers, the detection signal from sensor element 130*a*, $V_{130}$, is related to (e.g., proportional to) the intensity of s-polarized light, S, incident on the sensor pixel as follows:

$$V_{130} \propto t \cdot S.$$

The p-polarized light reflected by polarizer layer 120 returns to sensor element 110*a* where a portion is absorbed, further contributing to the signal produced by the sensor element, and another portion is transmitted, exiting sensor 100 as reflected light. Again, for an intensity P of p-polarized light initially incident on the sensor pixel and assuming a perfect polarizer, this means that an amount t·P is incident on sensor 110*a*, and the same proportion, (1−t), of this light further contributes to signal $V_{110}$. Thus, for this idealization, the signal from top sensor element 110 can be expressed as:

$$V_{110} = (1-t) \cdot [(1+t) \cdot P + S].$$

Accordingly, based on the signals $V_{110}$ and $V_{130}$ from the top and bottom sensor elements, it is possible to determine values for both P and S, assuming that the transmission properties, t, of top sensor pixel are known. Accordingly, each sensor pixel can provide a value for P, a value for S, and an intensity (I=P+S).

The transmission properties, t, of top sensor pixel, and other properties (e.g., the transmission and reflection properties of the polarizer layer, and/or detection efficiency of sensor layer 130) can be determined by appropriate calibration of each layer. For example, the properties of each layer can be determined independently under controlled conditions and the performance of each layer in the final sensor calculated from the known performance of each constituent layer. Alternatively, or additionally, the sensor can be calibrated using known illumination conditions before being deployed in its end-use application.

Other types of linear polarizers can also be used. Generally, any element having polarization-dependent transmission properties that can be integrated into a sensor between the top and bottom sensor layers can be used, including both reflective and absorptive polarizers. For example, dielectric gratings, air gap gratings, or other structures such as a photonic crystal, quasiperiodic structure, or unidirectionally random structure, may be used. In some embodiments, a stained-polymer grating may be used, such as an iodine-stained PVA film. Such films are commonly used as linear polarizers for liquid crystal displays.

In some embodiments, a circular polarizer can be used. For instance, the polarizing layer can be formed from a chiral liquid crystal polymer arranged to reflect circularly polarized light of one handedness, while transmitting light having the orthogonal polarization state.

Figure 2:
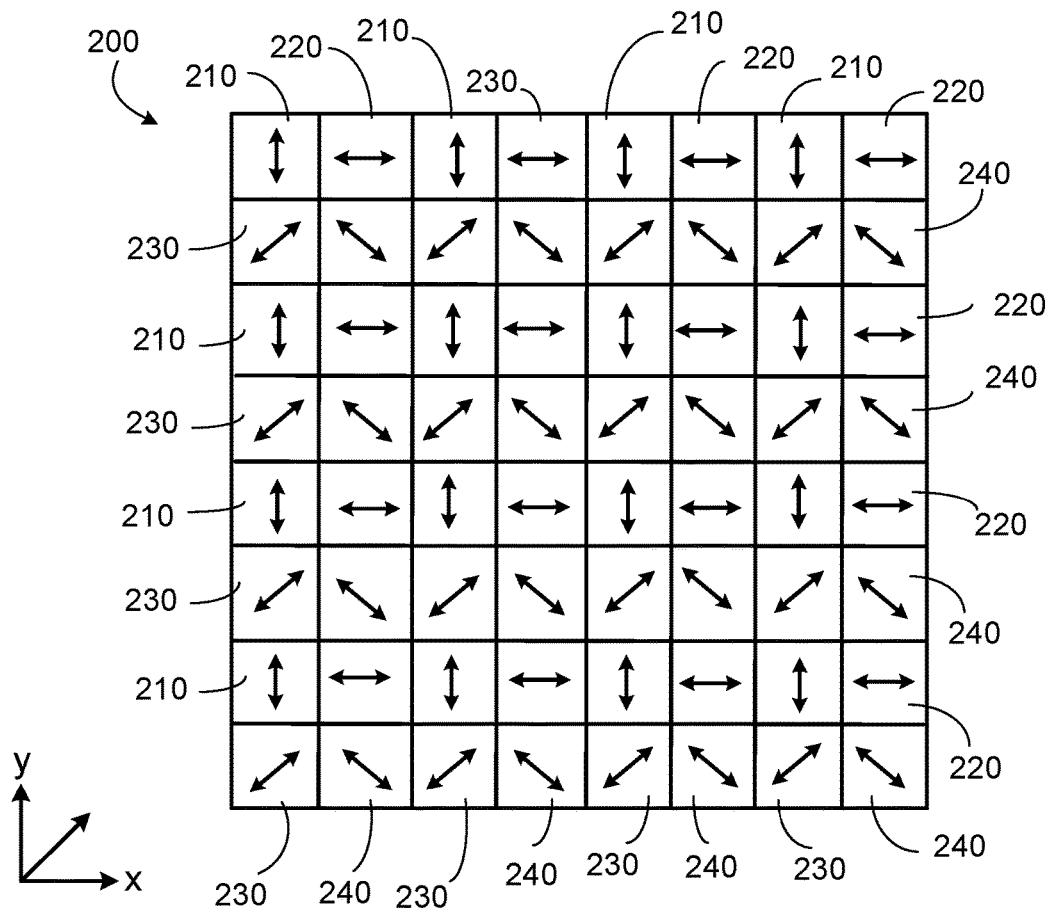
FIG. 2 is a top view of a polarizer array for a polarization-sensitive sensor.

In the foregoing embodiments, polarizer layer 120 is a uniform layer having a pass axis that is the same for all the sensor pixels. However, patterned polarizers are also possible. For example, referring to FIG. 2, a polarizer layer 200 includes an array of polarizing elements 210, 220, 230, and 240, arranged in groups of four. Each of these elements has its pass axis oriented differently to the others. Specifically, elements 210 have their pass axis aligned parallel to the y-direction, elements 220 parallel to the x-direction, elements 230 at 45° to the x-axis (measured anti-clockwise), and elements 240 at 135°. Each polarizing element is registered to a corresponding sensor element of the top sensor layer and the bottom sensor layer. Accordingly, for each group of four sensor pixels, each pair of signals provides information about polarization intensities in different directions.

Furthermore, while the sensor elements in the top and bottom sensor of sensor 100 are the same size and the sensors have the same pixel count, other implementations are also possible. For example, the pixel count of the two sensors can be different. In some implementations, the top sensor has a lower resolution than the bottom pixel, allowing each pixel to have a larger aperture and increase light transmission to the polarizer layer and bottom sensor.

Figure 3:
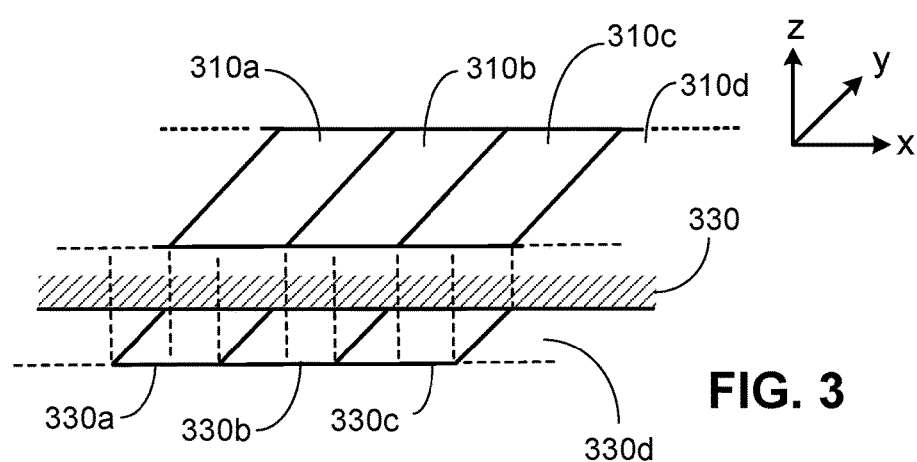
FIG. 3 is a perspective view of a portion of another embodiment of a polarization-sensitive sensor.

In sensor 100, sensor elements of the top sensor array are registered with corresponding sensor elements in the bottom sensor array, however this is not always the case. In some embodiments, one or both of the sensor layers can feature elements that are laterally offset with respect to an adjacent sensor layer. For example, referring to FIG. 3, a sensor (depicted in part) includes a top sensor layer 310, a polarizer layer 320, and a bottom sensor layer 330. Top sensor layer 310 includes transmissive sensor elements 310*a*, 310*b*, and 310*c*. Bottom sensor layer includes sensor elements 330*a*, 330*b*, and 330*c*, which are laterally offset in the x-direction with respect to sensors 310*a*, 310*b*, and 310*c*, respectively. In contrast, the top and bottom sensor elements in sensor 100 are registered to each other, dividing the sensor into an array of tiled sensor pixels. In sensor 300, on the other hand, the result is that a sensor element in the bottom sensor layer detects light transmitted by more than one pixel in the top sensor layer. Generally, the amount of offset can vary. In some embodiment, the lateral offset can be half the pixel width. Furthermore, in some embodiments, pixels are offset in both the x- and y-directions.

Figure 4:
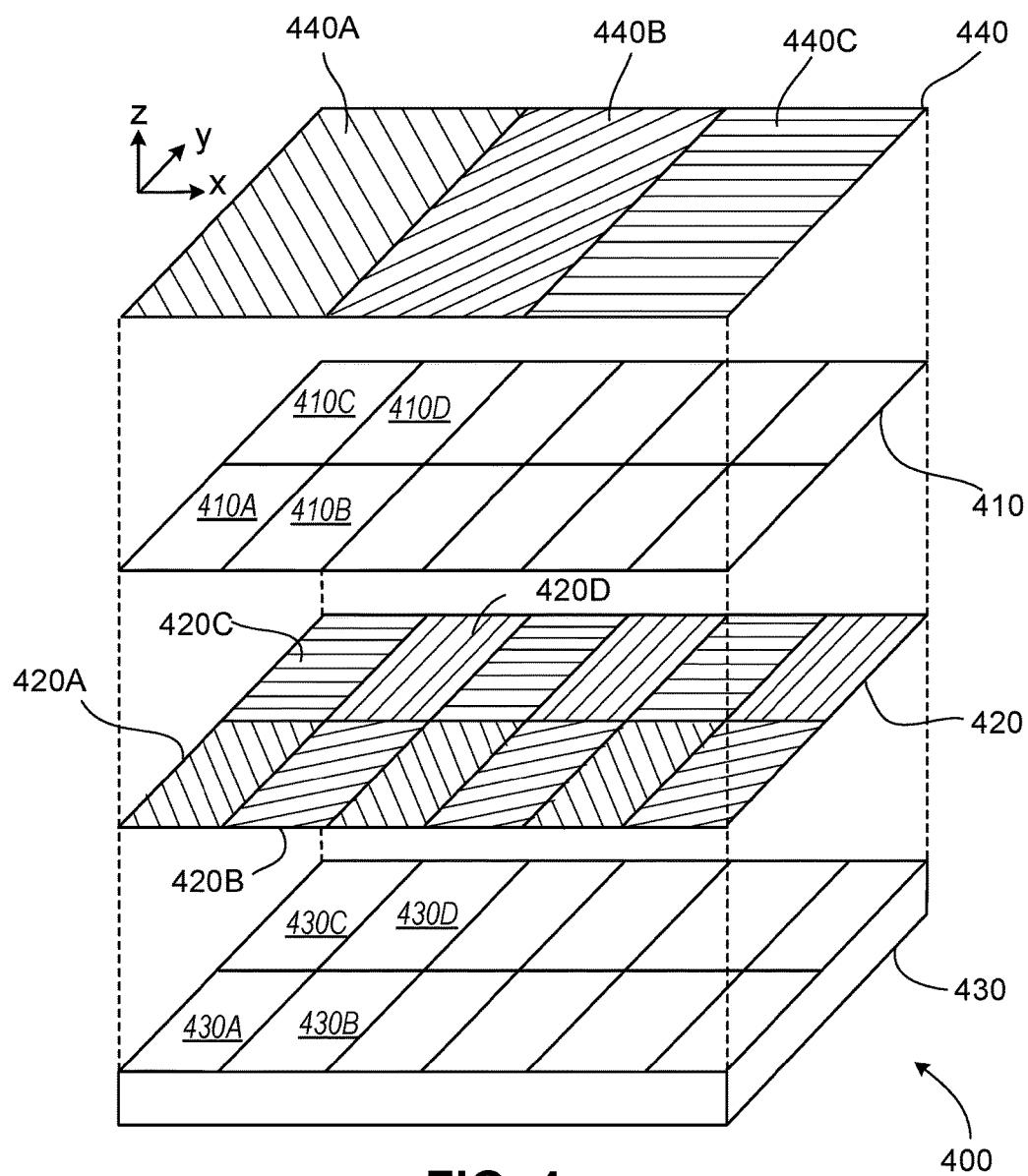
FIG. 4 is an exploded perspective view of a further embodiment of a polarization-sensitive sensor.

Polarization-sensitive image sensors can include other components in addition to the three layers described above. For example, referring to FIG. 4, a sensor 400 includes a color filter layer 440 in addition to a top sensor layer 410, a polarizer layer 420, and a bottom polarizer layer 430. Color filter layer includes tiled color filter elements 440A, 440B, and 440C, each having different spectral transmission properties. For example, for a sensor configured for operation in the visible portion of the spectrum, the three filter elements can transmit red, green, and blue light, respectively or cyan, magenta, and yellow light. More generally, the filter elements can be configured to transmit other spectral bands as desired, such as narrow bands (e.g., having a full width half maximum of 50 nm or less, e.g., 10 nm, 20 nm, 30 nm, 40 nm). In some embodiments, the color filter elements can be configured to transmit different wavelength bands in the infrared spectrum. The color filter elements can be absorptive color filters, such as those used in liquid crystal displays, for example. Reflective color filters (e.g., dichroic mirrors) are also possible.

Each color filter element in layer 440 is registered to four corresponding sensor pixels. In particular, color filter element 440A is registered to partially-transmissive sensor elements 410a, 410b, 410c, and 410d. Color filter elements 440B and 440C are similarly registered to corresponding partially-transmissive sensor elements. Partially-transmissive sensor elements 410a, 410b, 410c, and 410d are registered to polarizer elements 420a, 420b, 420c, and 420d, respectively, which are registered to sensor elements 430a, 430b, 430c, and 430d in sensor layer 430, respectively.

During operation, light is incident first on color filter layer 440 which spectrally filters the light, preferentially transmitting different spectral content through each type of filter. Accordingly, the light that is incident on transmissive sensor elements 410a, 410b, 410c, and 410d has different spectral content compared to light incident on the other elements of layer 410 depicted in FIG. 4. The same is true for the additional layers of sensor 400, and the result is that the sensor provides information about the spectral content of an incident intensity pattern in additional to polarization and spatial intensity information.

While sensor 400 is depicted as including three different color filter elements, more generally, color filter layer 440 can include any number of different filter elements (e.g., 4 or more types, 5 or more types, 6 or more types, such as 10 or 12 different filter types). Moreover, as for the previously described sensor, only a small number of elements are depicted and, in general, the sensor can include may many more sensor pixels than the dozen depicted in FIG. 4.

Alternatively, or in addition, to a color filter layer, sensors can include other functional layers, such as birefringent layers (e.g., quarter or half wave plates), passivation layers, antireflection coatings, and/or optical hard coats, for example. In some embodiments, sensors can include a microlens array for coupling light into the pixels, e.g., to provide more surface-normal incidence. For example, a microlens array with a microlens registered to each pixel can be provided on the top surface of the sensor.

Alternatively, or additionally, in some embodiments a quarter wave retarder is included adjacent the polarizing layer to convert transmitted linearly polarized light into circularly polarized light. In other words, the compound linear polarizer and quarter wave plate combinations operates as a circular polarizer for pass state polarization.

In general, the polarization-sensitive image sensors described above can be manufactured using techniques commonly used in semiconductor device manufacturing, specifically wafer processing techniques. For example, the component portions of polarization-sensitive image sensors can be formed by sequentially depositing layers of material onto a substrate layer and patterning each layer as necessary. Layer deposition can be performed using a variety of techniques, depending on the nature of the layer being formed (e.g., the material, thickness, crystallinity, etc.) and the nature of the underlying surface on which the layer is formed. Exemplary deposition techniques include physical vapor deposition (PVD), chemical vapor deposition (CVD), electrochemical deposition (ECD), molecular beam epitaxy (MBE) and atomic layer deposition (ALD).

Layer patterning is commonly performed using lithographic techniques, in which a pattern is transferred to a resist layer and a subsequent etch step transfers the pattern from the resist layer to an overlying or underlying layer of material. The initial patterning of the resist layer can be performed using photolithography or imprint lithography, for example. Wet, dry, and/or plasma etching can be used to remove material. Polishing processes (e.g., chemical mechanical polishing) can be used to planarize exposed surfaces.

In some cases, the bottom sensor is formed on a substrate, the polarizing layer is then formed on top of the bottom sensor, and finally the top sensor is formed on top of the polarizing layer. Passivation layers (e.g., formed from $SiO_2$ or some other dielectric material) can be formed between each active layer. The passivation layers can be planarized to provide a flat surface on which to formed the subsequent active layer.

Alternatively, each sensor can be formed on a separate substrate during separate manufacturing processes and the polarizing layer formed on one of the sensors. The two components are then bonded together in a subsequent step to provide the polarization-sensitive image sensor. Alternatively, or additionally, each active layer can be formed separately and then bonded to corresponding spacer layers subsequently. Such approaches may also be desirable where different components are manufactured by different vendors.

Wafer processing techniques can also be used to form multiple devices on a single wafer, which is then diced to yield individual sensors or component layers.

The polarization-sensitive image sensors may be further packaged to provide a robust component that can be readily integrated into larger systems, e.g., by integration onto printed circuit boards. Chip packaging techniques conventionally used for packaging integrated circuits, sensor arrays, LEDs, and diode lasers can be used.

Figure 5:
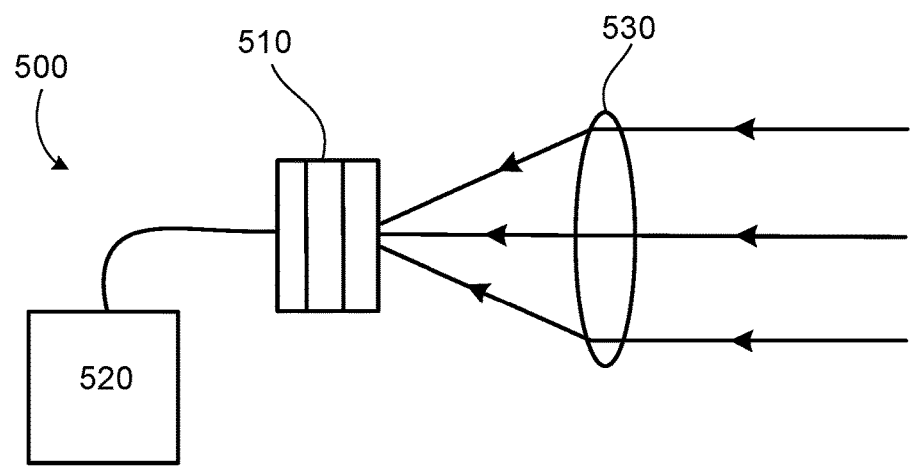
FIG. 5 is a schematic view of an imaging system that includes a polarization-sensitive sensor.

In general, polarization-sensitive image sensors can be used in a variety of applications where information about the polarization distribution of a light field may be useful. For example, polarization-sensitive image sensors can be used in imaging applications where polarization sensitivity is desired. An example of a light sensing system using a polarization-sensitive image sensor is shown in FIG. 5. In particular, a light sensing system 500 includes a polarization-sensitive sensor 510 and focusing optics 530. Sensor 510 is in communication with an electronic processing module 520. During operation, focusing optics images light onto the top surface of sensor 510, which detects the focused light and sends corresponding signals to electronic processing module 520. The electronic processing module analyzes the signals to determine intensity information of the focused light field on the sensor, and also information about the polarization distribution of the light field.

Light sensing system 500 is commonly part of a larger system, such as a camera (e.g., consumer camera like a DLSR or mobile phone camera). In some embodiments, light sensing system is part of a machine vision system in which information about the polarization distribution of a detected image is desired.

Alternatively, or additionally, non-imaging applications are also possible. For example, in some embodiments, polarization-sensitive image sensors are used in spectroscopic applications, e.g., where incoming light is dispersed into its constituent wavelengths, each of which are directed to different areas of the sensor. The sensor then provides information about the polarization state at each wavelength (or band of wavelengths) in addition to the intensity.

In some embodiments, polarization-sensitive image sensors can be used in surface-inspection applications. For example, a sensor can be used in combination with a polarized light source to determine whether a surface provides a specular or diffuse reflection (a specular surface will preserve more polarization in reflection, while a diffuse surface will have a depolarizing effect). This can be used, for example, in a manufacturing environment or other instances where automated surface inspection may be required.

Some aspects of the polarization-sensitive sensors and systems containing these sensors described here can be implemented in digital electronic circuitry, or in computer software, firmware, or hardware, including the structures disclosed in this specification and their structural equivalents, or in combinations of one or more of them. For example, in some implementations, the electronic processing module 520 can be implemented using digital electronic circuitry, or in computer software, firmware, or hardware, or in combinations of one or more of them.

The term "electronic processing module" encompasses all kinds of apparatus, devices, and machines for processing data and/or control signal generation, including by way of example a programmable processor, a computer, a system on a chip, or multiple ones, or combinations, of the foregoing. The electronic processing module can include special purpose logic circuitry, e.g., an FPGA (field programmable gate array) or an ASIC (application specific integrated circuit). The electronic processing module can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The electronic processing module and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes described above can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

An electronic processing module may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

Figure 6:
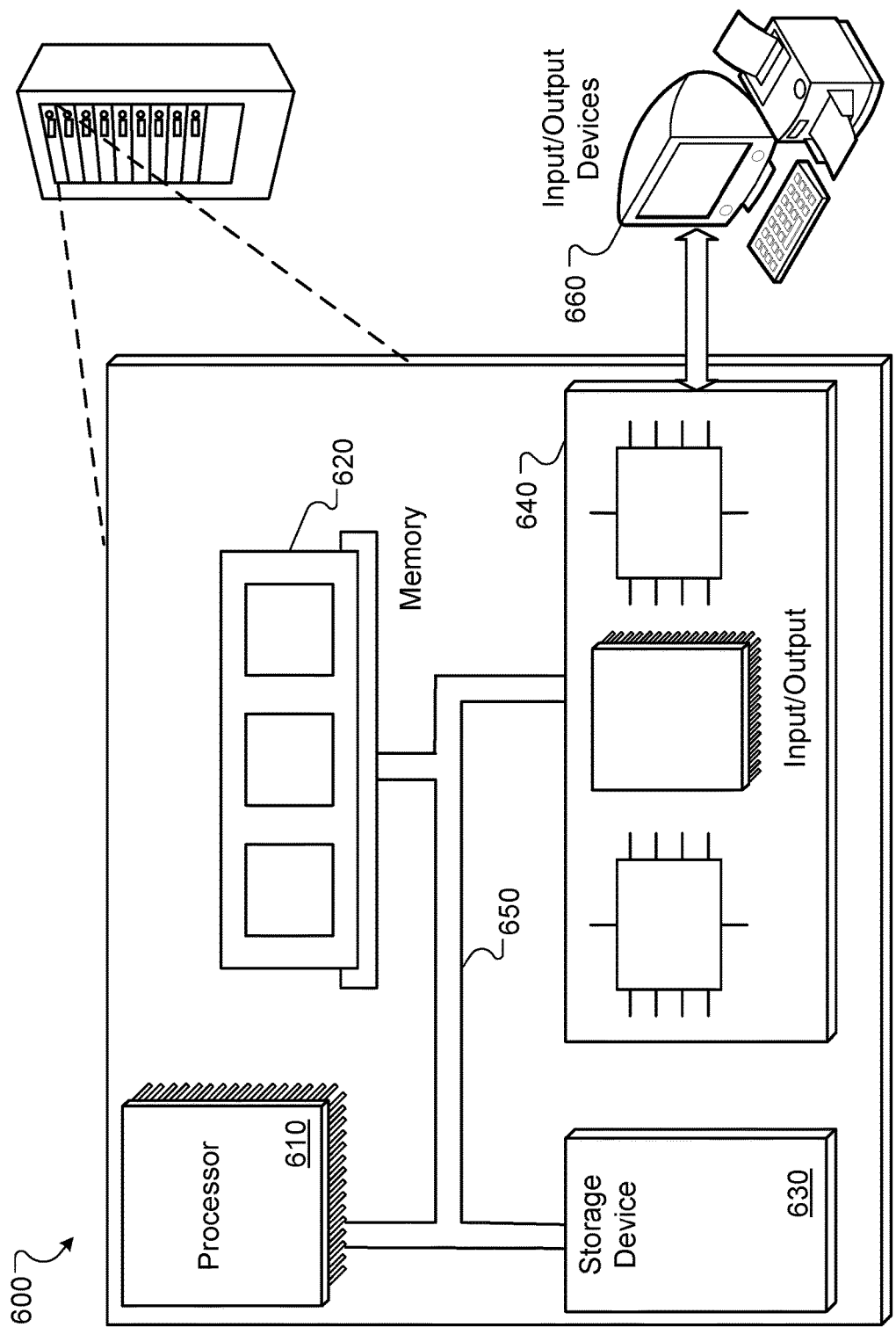
FIG. 6 is a schematic view of an embodiment of an electronic processing module.

FIG. 6 shows an example electronic processing module 600 that includes a processor 610, a memory 620, a storage device 630 and an input/output device 640. Each of the components 610, 620, 630 and 640 can be interconnected, for example, by a system bus 650. The processor 610 is capable of processing instructions for execution within the module 600. In some implementations, the processor 610 is a single-threaded processor, a multi-threaded processor, or another type of processor. The processor 610 is capable of processing instructions stored in the memory 620 or on the storage device 630. The memory 620 and the storage device 630 can store information within the system 600.

The input/output device 640 provides input/output operations for the module 600. In some implementations, the input/output device 640 can include one or more of a network interface devices, e.g., an Ethernet card, a serial communication device, e.g., an RS-232 port, and/or a wireless interface device, e.g., an 802.11 card, a 3G wireless modem, a 4G wireless modem, etc. In some implementations, the input/output device can include driver devices configured to receive input data and send output data to other input/output devices, e.g., keyboard, printer and display devices 660. In some implementations, mobile computing devices, mobile communication devices such as a smartphone or tablet computer, and other devices can be used.

A number of embodiments have been described. Nevertheless, it will be understood that various modifications may be made without departing from the spirit and scope of the invention. Accordingly, other embodiments are within the scope of the claims.

What is claimed is:

1. A system, comprising:
   a device, comprising:
   a first multi-element image sensor;
   a second multi-element image sensor;
   a polarizing layer positioned between the first and second multi-element image sensors,
   wherein a portion of light having a first polarization state incident on the device along a first direction is transmitted through the first image sensor, is transmitted through the polarizing layer, and is detected by the second image sensor, and
   light having a second polarization state orthogonal to the first polarization state incident on the device along the first direction is transmitted through the first image sensor, is blocked by the polarizing layer, and is substantially reflected by the polarizing layer, and
   wherein at least some of the blocked light is detected by the first image sensor;
   an electronic processing module in communication with the device,
   wherein during operation the device detects incident light, sends signals to the electronic processing module, and the electronic processing module determines information about an intensity of the incident light and information about a polarization of the incident light based on the signals,
   wherein the signals sent by the device comprises a first signal associated with the first multi-element image sensor and a second signal associated with the second multi-element image sensor, and
   wherein the electronic processing module further determines the information about the polarization of the incident light based on both the first signal and the second signal.

2. The system of claim 1, wherein each element of the first multi-element image sensor is registered to a corresponding element of the second multi-element image sensor.

3. The system of claim 1, wherein each element of the first multi-element image sensor is laterally offset to a corresponding element of the second multi-element image sensor.

4. The system of claim 1, wherein either or both of the first and second multi-element image sensor are a complementary metal-oxide-semiconductor (CMOS) array, a photodiode array, or a charge-coupled device (CCD) array.

5. The system of claim 1, wherein the polarizing layer is a linear polarizer having a single pass axis direction.

6. The system of claim 1, wherein the polarizing layer is a circular polarizer.

7. The system of claim 1, wherein the polarizing layer comprises a plurality of polarizing elements, wherein adjacent polarizing elements have their pass axes differently oriented.

8. The system of claim 7, wherein each element of the polarizing layer corresponds to an element of the first multi-element image sensor.

9. The system of claim 8, wherein the corresponding elements of the polarizing layer and the first multi-element image sensor are registered with one another.

10. The system of claim 7, wherein each element of the polarizing layer corresponds to an element of the second multi-element image sensor.

11. The system of claim 10, wherein the corresponding elements of the polarizing layer and the second multi-element image sensor are registered with one another and with corresponding elements of the first multi-element image sensor.

12. The system of claim 1, wherein the polarizing layer comprises a reflective polarizer.

13. The system of claim 1, wherein the polarizing layer comprises a polarizing metallic grating, a dielectric grating, or an air gap grating.

14. The system of claim 1, further comprising a color filter layer comprising an array of color filter elements.

15. The system of claim 1, wherein the information about the polarization of the incident light comprises a relative intensity of incident light polarized in a first direction and a second direction orthogonal to the first direction.

16. The system of claim 1, wherein information about the intensity and polarization are determined for each of a plurality of locations across the device.

17. The system of claim 1, further comprising one or more optical elements arranged to focus the incident light onto the device.

18. The system of claim 17, wherein the one or more optical elements image light onto the device.

19. A camera, comprising the system of claim 1.

20. A spectroscopic detector, comprising the system of claim 1.

* * * * *